(12) United States Patent
Werner et al.

(10) Patent No.: US 9,318,468 B2
(45) Date of Patent: Apr. 19, 2016

(54) 3-D INTEGRATED SEMICONDUCTOR DEVICE COMPRISING INTERMEDIATE HEAT SPREADING CAPABILITIES

(75) Inventors: Thomas Werner, Dresden (DE);
Michael Grillberger, Radebeul (DE);
Frank Feustel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 770 days.

(21) Appl. No.: 13/300,913

(22) Filed: Nov. 21, 2011

(65) Prior Publication Data

US 2012/0061818 A1 Mar. 15, 2012

Related U.S. Application Data

(62) Division of application No. 12/506,536, filed on Jul. 21, 2009, now Pat. No. 8,080,866.

(30) Foreign Application Priority Data

Aug. 29, 2008 (DE) .......................... 10 2008 044 986

(51) Int. Cl.
*H01L 23/34* (2006.01)
*H01L 25/065* (2006.01)

(52) U.S. Cl.
CPC .......... *H01L 25/0657* (2013.01); *H01L 2224/16* (2013.01); *H01L 2225/06513* (2013.01); *H01L 2225/06541* (2013.01); *H01L 2225/06589* (2013.01); *H01L 2924/1305* (2013.01)

(58) Field of Classification Search
CPC .............. H01L 2225/06589; H01L 2924/1305
USPC ................... 257/321, 686, 774, 712, E23.141, 257/E23.011
See application file for complete search history.

(56) References Cited

U.S. PATENT DOCUMENTS

| | | | |
|---|---|---|---|
| 2007/0075413 A1 | 4/2007 | Egawa | 257/686 |
| 2007/0176277 A1 | 8/2007 | Brunnbauer et al. | 257/686 |
| 2008/0042261 A1 | 2/2008 | Wolter et al. | 257/706 |
| 2009/0294947 A1* | 12/2009 | Tain et al. | 257/686 |
| 2009/0321911 A1* | 12/2009 | Son | 257/686 |

FOREIGN PATENT DOCUMENTS

JP          2006229163 A      8/2006    ............. H01L 25/18

OTHER PUBLICATIONS

Translation of Official Communication from German Patent Office for German Patent Application No. 10 2008 044 986.5-33 dated Apr. 17, 2009.
Translation of Summons to an Interview from German Patent Office for German Patent Application No. 10 2008 044 986.5 dated May 26, 2014.

* cited by examiner

*Primary Examiner* — Tran Tran
(74) *Attorney, Agent, or Firm* — Amerson Law Firm, PLLC

(57) ABSTRACT

In a three-dimensional chip configuration, a heat spreading material may be positioned between adjacent chips and also between a chip and a carrier substrate, thereby significantly enhancing heat dissipation capability. Furthermore, appropriately sized and positioned through holes in the heat spreading material may enable electrical chip-to-chip connections, while responding thermally conductive connectors may extend to the heat sink without actually contacting the corresponding chips.

27 Claims, 7 Drawing Sheets

3-D INTEGRATED SEMICONDUCTOR DEVICE COMPRISING INTERMEDIATE HEAT SPREADING CAPABILITIES

CROSS-REFERENCE TO RELATED APPLICATION

This is a divisional of co-pending application Ser. No. 12/506,536, filed Jul. 21, 2009.

BACKGROUND OF THE INVENTION

1. Field of the Invention

The present disclosure generally relates to the field of fabricating integrated circuits, and, more particularly, to thermal management in 3-D devices.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Although transistor elements are the dominant circuit element in highly complex integrated circuits which substantially determine the overall performance of these devices, other components, such as capacitors and resistors, and in particular a complex interconnect system or metallization system, may be required, wherein the size of these passive circuit elements may also have to be adjusted with respect to the scaling of the transistor elements in order to not unduly consume valuable chip area.

Typically, as the number of circuit elements, such as transistors and the like, per unit area may increase in the device level of a corresponding semiconductor device, the number of electrical connections associated with the circuit elements in the device level may also be increased, typically even in an over-proportional manner, thereby requiring complex interconnect structures which may be provided in the form of metallization systems including a plurality of stacked metallization layers. In these metallization layers, metal lines, providing the inner-level electrical connection, and vias, providing intra-level connections, may be formed on the basis of highly conductive metals, such as copper and the like, in combination with appropriate dielectric materials to reduce the parasitic RC (resistive capacitive) time constants, since, in sophisticated semiconductor devices, typically, signal propagation delay may be substantially restricted by a metallization system, rather than the transistor elements in the device level. However, expanding the metallization system in the height dimension to provide the desired density of interconnect structures may be restricted by the parasitic RC time constants and the constraints imposed by the material characteristics of sophisticated low-k dielectrics. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Thus, the complexity of semiconductor devices provided in a single semiconductor chip may be restricted by the capabilities of the corresponding metallization system and in particular by the characteristics of sophisticated low-k dielectric materials, since the number of metallization layers may not be arbitrarily increased.

For this reason, it has also been proposed to further enhance the overall density of circuit elements for a given size or area of a respective chip package by stacking two or more individual semiconductor chips, which may be fabricated in an independent manner, however, with a correlated design to provide, in total, a complex system while avoiding many of the problems encountered during the fabrication process for extremely complex semiconductor devices on a single chip. For example, appropriately selected functional units, such as memory areas and the like, may be formed on a single chip in accordance with well-established manufacturing techniques including the fabrication of a corresponding metallization system, while other functional units, such as a fast and powerful logic circuitry, may be formed independently as a separate chip, wherein, however, respective interconnect systems may enable a subsequent stacking and attaching of the individual chips to form an overall functional circuit, which may then be packaged as a single unit. In other cases, power circuitry operated at moderately high voltages and having a high power consumption may be combined with sensitive control circuits, wherein both functional units may be provided in separate chips. Thus, a corresponding three-dimensional configuration may provide increased density of circuit elements and metallization features with respect to a given area of a package, since a significantly larger amount of the available volume in a package may be used by stacking individual semiconductor chips. Although this technique represents a promising approach for enhancing volume packing density and functionality for a given package size for a given technology standard, while avoiding extremely critical manufacturing techniques, for instance in view of stacking a large number of highly critical metallization layers, the heat management of these three-dimensional chip arrangements may be difficult, in particular when high power consuming chips are included, as will be described with reference to FIG. 1.

FIG. 1 schematically illustrates a cross-sectional view of a three-dimensional semiconductor configuration 100 according to a typical conventional architecture. In the example shown, the three-dimensional device 100 comprises a first semiconductor chip 110, which is to be understood as a chip including circuit elements based on a semiconductor material, such as silicon and the like. The first semiconductor chip 110 may comprise a substrate 111, for instance a semiconductor material, such a as a silicon material, or any other appropriate carrier material, such as glass and the like. Furthermore, a device layer 112 may be provided above the substrate 111, which may comprise a plurality of semiconductor-based circuit elements, such as transistors, capacitors, resistors and the like, as is required for obtaining the desired electrical functional behavior of the chip 110. For convenience, any such circuit elements are not shown in FIG. 1. Additionally, the chip 110 may comprise a metallization system 113, which may include one or more metallization layers to establish the electrical connections between the circuit elements in the device layer 112. Moreover, the metallization system 113 may provide an appropriate interconnect structure to enable an electrical connection to a second chip 120 that is attached to the first chip to form a three-dimensional chip configuration, thereby significantly enhancing the volume packing density of circuit elements for a given package volume, as discussed above. For instance, corresponding interconnect structures may be provided in the form of vias 113A, which may extend through the metallization system 113 and may directly connect to the device level 112, if required. Similarly, the second chip 120 may comprise a substrate 121, such as a silicon material or any other appropriate carrier material for forming thereon an appropriate semiconductor material, for instance in the form of silicon, in order to define a device level 122, in and above which corresponding circuit elements may be provided. Furthermore, a metallization system 123 may be provided "above" the device level 122 and may comprise one or more metallization layers for providing the required electrical connections of the circuit elements in the device level 122 and an appropriate contact structure for connecting to the first chip 110. For example, the chips 110 and 120 may comprise appropriate bump structures on the basis of which an electrical connection may be established, thereby also attaching the chip 120 with a chip 110 in a mechanically reliable manner. For this purpose, the metallization system 123 may also comprise appropriate bumps or other contact elements (not shown) in combination with corresponding vias 123A for establishing the chip-to-chip connections. It should be appreciated that attaching the chips 110 and 120 by means of the corresponding metallization systems 113, 123, respectively, may be one of a plurality of possibilities. For example, if the number of chip-to-chip connections is moderately low, the chip 120 may be attached to the chip 110 by means of the substrate 121, wherein corresponding through hole vias may establish the electrical connection from the metallization system 113 to the device layer 122 of the chip 120. On the other hand, the metallization system 123 is then available for connecting to a carrier substrate 130, which may be attached to the chip 120, thereby allowing a moderately complex electrical interconnection system from the chip 120 to the carrier substrate 130, which in turn may provide electrical connection to the periphery (not shown). In still other cases, the substrates 111 and 121 may be attached to each other on the basis of corresponding through hole vias for establishing the required chip-to-chip connections, while the corresponding metallization systems 113 and 123 may be available for connecting to further chips, carrier substrates and the like, when a three-dimensional configuration of increased complexity is required. Furthermore, as shown in FIG. 1, the device 100 may comprise a heat sink 140 that is attached to the carrier substrate 130 and may provide an increased surface area for forced or natural convection of air. In other cases, the heat sink may include sophisticated liquid-based cooling systems or may comprise electrically active cooling systems, such as Peltier elements and the like.

Typically, the semiconductor device 100 as shown in FIG. 1 may be formed on the basis of well-established process techniques including the formation of the chips 110 and 120 by using typical manufacturing techniques of semiconductor devices. That is, the chips 110 and 120 may be formed on dedicated wafers by performing a plurality of manufacturing steps for fabricating circuit elements in the corresponding device levels 112, 122, followed by manufacturing techniques for fabricating the corresponding metallization systems 113 and 123, wherein appropriate process steps are also included to provide the vias 113A, 123A for establishing the chip-to-chip connection in a later manufacturing phase. After completing the basic conductor chips, the corresponding carrier wafers may be separated into single chips, thereby providing a plurality of chips 110 and a plurality of chips 120. Thereafter, the chips 110, 120 may be aligned to each other and may be connected, for instance using an adhesive, a corresponding bump structure including, for instance, a solder material, which may be reflowed to establish an electrical connection and also mechanically adhering the chip 110 to the chip 120. Similarly, the carrier substrate 130 may be attached to the resulting stacked chip configuration and finally the heat sink 140 may be installed. It should be appreciated that the process may involve a plurality of additional well-established packaging techniques, for instance encapsulating the chips 110, 120 after attaching to the carrier substrate 130.

During operation of the device 100 in the stacked configuration, heat is generated, for instance, substantially within the corresponding device levels 112 and 122 due to the operation of the corresponding circuit elements, for instance in the form of transistors, resistors and the like. Depending on the specific configuration, frequently, a chip with moderately high power consumption may be provided within the device 100, wherein a corresponding enhanced thermal connection to the heat sink 140 may be required so that the allowable operating temperature within the device levels 112 and 122 may not be exceeded. Thus, conventionally, it is difficult to provide an efficient heat dissipation for any intermediate chips, in particular if more than two individual chips are provided within the device 100, so that the increase in volume packing density may frequently not be compatible with the available heat dissipation capabilities of conventional stacked chip configurations. Thus, due to the reduced heat dissipation capabilities of the individual chips in the configuration 100, significant constraints with respect to overall complexity and thus power consumption of the corresponding individual chips, as well as for their spatial arrangement within the three-dimensional configuration, may be imposed, thereby reducing overall performance and efficiency of the conventional three-dimensional chip configurations.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques in which the heat dissipation capabilities in three-dimensional stacked chip configurations may be enhanced by providing a heat spreading material or a heat distribution material between at least some of the stacked semiconductor chips. The heat spreading material may be provided in the form of any appropriate material having a moderately high thermal conductivity to efficiently dissipate heat from the corresponding adjacent chips, which may be accomplished by providing a thermally highly conductive connection to a heat sink. In some illustrative embodiments, the heat spreading material may connect to a corresponding heat sink by "external" connectors, which may not directly be in contact with the chips, so that an external "bypass" for the heat conduction may be provided via the heat spreading material and the corresponding thermal connectors. In other illustrative aspects disclosed herein, the heat spreading material may directly be provided on the individual chips and may connect to a peripheral chip portion that may act as an efficient heat sink and/or may provide a thermally highly conductive connection to a heat sink of the stacked chip configuration. Consequently, significantly enhanced heat dissipation capabilities may be obtained on the basis of the heat spreading material, thereby enabling the incorporation of power consuming chips with an enhanced degree of flexibility in configuring the three-dimensional chip stack, while at the same time an increased volume packing density may be obtained. Hence, the number of circuit elements per chip package may be increased compared to conventional techniques for stacking two or more individual chips.

One illustrative semiconductor device disclosed herein comprises a stacked chip configuration that comprises a first chip comprising a first substrate and first circuit elements formed above the first substrate. Furthermore, the stacked chip configuration comprises a second chip comprising a second substrate and second circuit elements formed above the second substrate. Additionally, a heat spreading material is positioned between the first chip and the second chip and has a plurality of through holes. Furthermore, the semiconductor device comprises a plurality of electrical connections extending through the plurality of through holes to electrically connect the first and second chips.

A further illustrative semiconductor device disclosed herein comprises a first chip comprising a first substrate, a plurality of first circuit elements, a first metallization system and a first heat spreading layer. Additionally, the semiconductor device comprises a second chip attached to the first chip and comprising a second substrate, a plurality of second circuit elements and a second metallization system, wherein the second substrate or the second metallization system is attached to the first heat spreading layer.

An illustrative method disclosed herein relates to forming a three-dimensional semiconductor device. The method comprises providing a first chip comprising a first substrate, a plurality of first circuit elements and a first metallization system. Furthermore, the method comprises providing a second chip comprising a second substrate, a plurality of second circuit elements and a second metallization system. Moreover, a heat spreading material is attached to the first chip. Additionally, the second chip is attached to the heat spreading material so as to obtain a three-dimensional chip configuration.

BRIEF DESCRIPTION OF THE DRAWINGS

The disclosure may be understood by reference to the following description taken in conjunction with the accompanying drawings, in which like reference numerals identify like elements, and in which.

Figure 1:
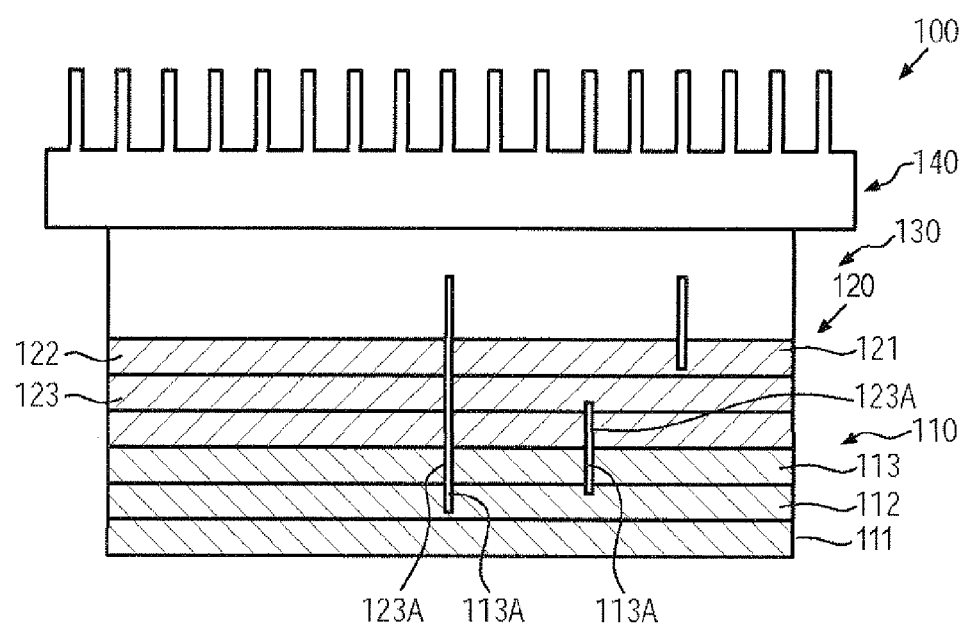
FIG. 1 schematically illustrates a cross-sectional view of a conventional three-dimensional chip configuration with restricted heat dissipation capabilities.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure provides semiconductor devices and techniques in which the heat dissipation capabilities of three-dimensional chip configurations may be enhanced by providing heat spreading material between two adjacent stacked chips, while at the same time an appropriate thermal coupling of the heat spreading material to an appropriate heat sink may be provided. Additionally, the required chip-to-chip connections may be established by providing appropriate "though holes" within the heat spreading material, which may be aligned to corresponding contact elements, such as through hole vias, solder bumps and the like, so that the electrical chip-to-chip connections may be established substantially without deteriorating the overall heat conducting capabilities of the heat spreading material. In some illustrative embodiments, the heat spreading material may be provided in the form of a separate piece of material, which may be attached to one of the chips, for instance on the basis of appropriate adhesives, bump materials and the like, and may thus act as a carrier for receiving another chip, which may then be attached to the heat spreading material such that additionally the required electrical connections may be formed. For example, a plurality of appropriate materials may be available, which may represent electrically conductive materials, insulating materials and the like, providing a desired high thermal conductivity, wherein the coefficient of thermal expansion may also be appropriately adapted so as to not unduly introduce thermally induced stress between the individual stacked chips. For example, thermally conductive materials having a similar coefficient of thermal expansion compared to the semiconductor chips may be used, thereby substantially avoiding any stress components of the stacked semiconductor device during operation, even if a cycled mode of operation may be applied. In other cases, appropriate dielectric materials and/or metal-containing materials may be thermally and mechanically attached to one of the chips, while attachment to the subsequent semiconductor chip may be less critical, thereby enabling a certain degree of independence with respect to the thermal response of the individual semiconductor chip, which may produce a different amount of heat and which may thus have a certain difference in temperature during operation, at least during various operating periods. Furthermore, the chip external heat spreading material may be efficiently coupled to a heat sink via corresponding thermally conductive connectors, thereby providing an efficient heat dissipation for each individual chip via the heat spreading material, the connectors and the heat sink.

In still other illustrative embodiments disclosed herein, the heat spreading material may be provided in the form of a chip internal material layer, which may be provided, for instance, in the metallization layer and/or the substrate of the corresponding semiconductor chip, wherein, additionally, the overall chip size may be appropriately adapted to also accommodate a peripheral chip region, which may be used as a heat sink and/or as an efficient thermally conductive heat dissipation path via subsequent chips to an appropriate heat sink. Consequently, by providing the heat spreading material as a chip internal material in combination with a corresponding heat dissipation path, corresponding efforts in configuring a three-dimensional chip stack may be reduced and may be comparable to conventional approaches, in which corresponding heat spreading materials are not provided. That is, any additional components may readily be formed as chip internal components during the fabrication processes performed on wafer bases, while the subsequent assembly of the three-dimensional chip stack after dicing the corresponding wafers may be performed with a high degree of compatibility with conventional three-dimensional chip stacking and packaging techniques. For example, efficient heat spreading materials may be incorporated in the form of metals, as may also be used during the fabrication of metallization systems, and/or in the form of appropriately selected dielectric materials, depending on the overall process and device requirements.

In still other illustrative embodiments, the heat spreading material may be used for implementing "active" heat management systems in the three-dimensional chip configuration, for instance by providing corresponding thermocouples within the heat spreading material, which may be appropriately electrically connected to enable an efficient current controlled cooling effect, while in other cases a temperature gradient obtained during operation of the three-dimensional stack may be taken advantage of to generate electrical energy which may be supplied to one or more of the chips, while still providing a highly efficient dissipation of heat via the corresponding heat spreading material including the thermocouples.

With reference to FIGS. 2a-2d and 3a-3f, further illustrative embodiments will now be described in more detail, wherein reference may also be made to FIG. 1 when appropriate.

Figure 2A:
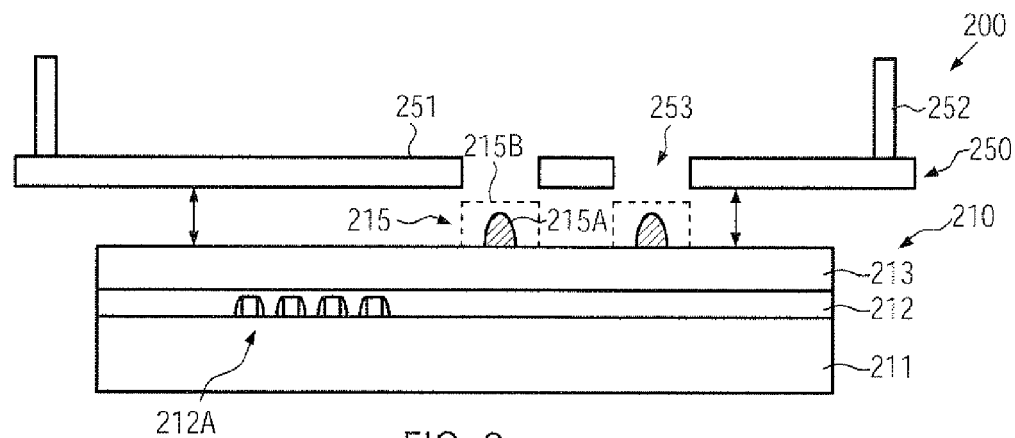
FIGS. 2a-2d schematically illustrate cross-sectional views and a top view of a semi-conductor device comprising a stacked chip configuration at various manufacturing stages in which an "external" heat spreading material may be positioned between adjacent chips, according to illustrative embodiments.

FIG. 2a schematically illustrates a cross-sectional view of a semiconductor device 200, i.e., a device having a stacked chip configuration, at an early manufacturing stage. As illustrated, the device 200 may comprise a first chip 210, which may comprise a substrate 211, such as a semiconductor material, an insulating material, a silicon-on-insulator (SOI) substrate or any combination of these components. Furthermore, a device layer 212 may be formed above the substrate 211 and may comprise circuit elements, such as transistors, capacitors, resistors and the like. For example, the device layer 212 may comprise a plurality of transistors 212A, for instance in the form of field effect transistors, bipolar transistors and the like. Frequently, the elements 212A form a complex electric circuit which may require a specific degree of power consumption, depending on the type of circuit considered and the complexity thereof. As previously discussed, a large number of electrical interconnections may be required between the individual circuit elements 212A, which may typically be established in a metallization system 213, which may comprise an appropriate number of metallization layers (not shown), wherein, however, the number of individual metallization layers may be restricted depending on the electrical performance required. Thus, a further increasing of the packing density in the device layer 212 may typically involve a higher number of metallization layers, which may frequently not be compatible with mechanical and thermal characteristics of the metallization system 213. Thus, the complexity of a desired overall circuit may be efficiently "divided" into specific functional units, such as memory areas, logic blocks, circuitry including power transistors and the like, which may per se have an appropriate degree of complexity with respect to the device level and the metallization system and which may be formed as separate semiconductor chips, wherein the finally desired overall function may be obtained by stacking a respective number of functional units in the form of individual chips. With respect to required chip-to-chip connections, the metallization system 213 and/or the substrate 211 may have formed therein an appropriate contact structure 215, which may have an appropriate counterpart on the substrate or the metallization system of a further chip to be attached to the chip 210. For instance, the contact structure 215 may comprise respective bumps 215A or metal regions 215B and the like, which may have an appropriate height dimension and lateral dimensions to allow a connection to a subsequent contact structure and also to allow the attaching of a heat spreading material 250 above the metallization system 213 without affecting the function of the contact structure 215. It should be appreciated that in other embodiments (not shown) the contact structure 215 may be formed "above" the substrate 211, that is, on an exposed surface thereof, in combination with an appropriate through hole structure (not shown) when the chip 210 is to be connected to another chip via the substrate 211.

The heat spreading material 250 may comprise a base layer 251, which may have formed therein corresponding through holes or openings 253, which are formed with respect to size and position to be compatible with the contact structure 215. For example, the base layer 251 may be provided in the form of any appropriate piece of material, such as a metal-containing material having a moderately high thermal conductivity, an insulating material, for instance in the form of dielectric materials well established in the field of semiconductor fabrication and the like. For example, semiconductor materials, such as silicon, oxides thereof, silicon nitride and the like, may be used. In other cases, a plurality of plastic materials as are well known in the art of techniques for assembling electronic components may be used, wherein, in some illustrative embodiments, an appropriate material composition may be selected so as to adjust a coefficient of thermal expansion of the base layer 251 to the chip 210. In other cases, the base layer 251 and/or any adhesive applied thereon to attach the material 250 to the chip 210 may provide a desired degree of elasticity, when a mismatch in the coefficient of thermal expansion may exist between a significant portion of the base layer 251 and the chip 210. Thus, a wide variety of materials may be used so as to allow an efficient adjustment of the coefficient of thermal expansion and the specific thermal conductivity. Moreover, a thickness of the base layer 251 may be selected in accordance with the overall requirements for the device 200, for instance with respect to packaging, total heat conductivity, mechanical stability and the like. For example, the thickness may range from approximately 50 μm to several hundred μm. Moreover, as illustrated in FIG. 2a, a lateral dimension of the material 250, i.e., of the base layer 251, may be greater than the lateral dimensions of the chip 210 so that corresponding thermally conductive connectors 252 may be positioned on the base layer 251 so as to be efficient outside of the actual chip area. Consequently, these "external" connectors 252 may enable establishment of a thermally highly conductive path to a heat sink, which may be positioned at the top of the device 200 in a finally assembled stage. The connectors 252 may be formed of the same or a different material as the base layer 251, for instance, appropriate metals, dielectric materials and the like may be used.

The semiconductor device 200 as shown in FIG. 2a may be formed on the basis of the following processes. The chip 210 may be fabricated by using well-established manufacturing techniques associated with the corresponding design rules and requirements as demanded by the circuitry to be realized within the device layer 212 and the metallization system 213. In addition, the contact structure 215 may be appropriately adapted to the provision of the heat spreading material 250, for instance by adapting a height thereof to a thickness of the base layer 251 so as to enable direct contact with a corresponding contact structure of a further chip to be attached to the chip 210. For this purpose, any appropriate techniques may be used, for instance, the bumps 215A may be provided with an appropriate height or the metal regions 215B may be formed with an increased height compared to conventional approaches.

Figure 2B:
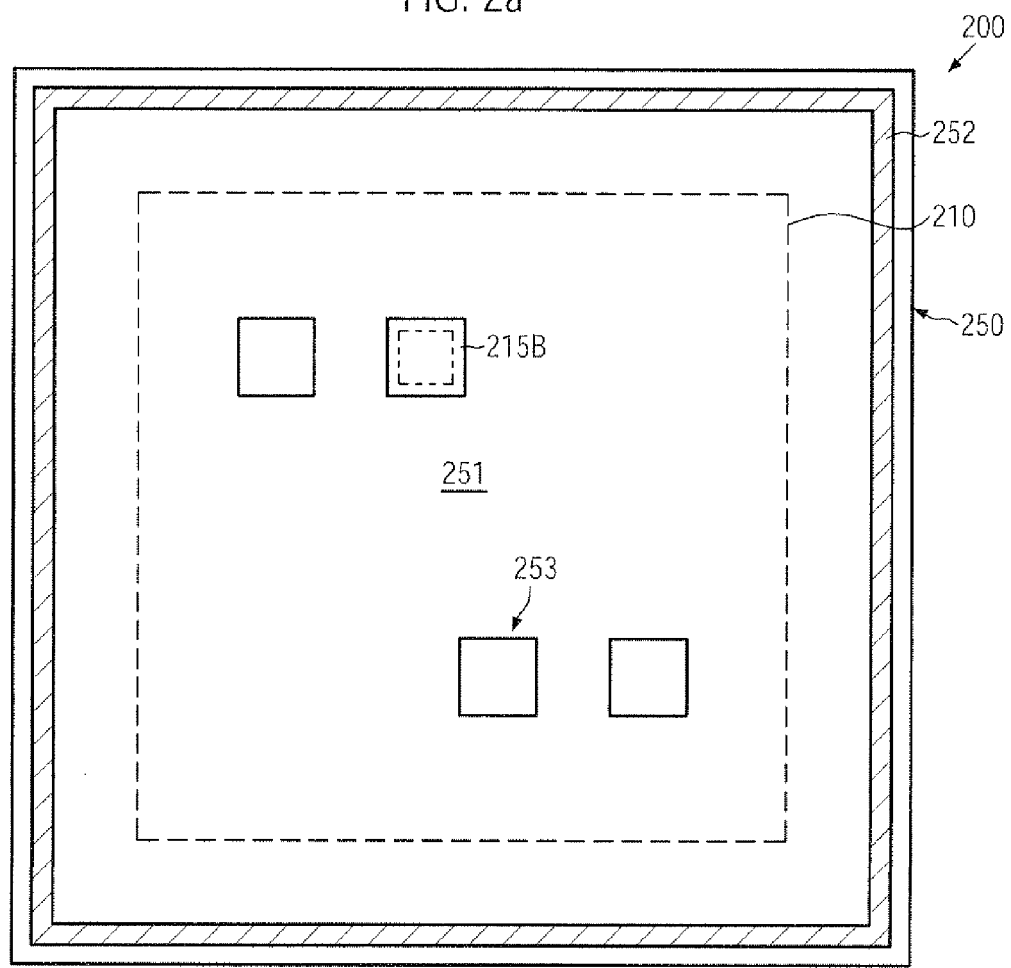

FIG. 2b schematically illustrates a top view of the device 200. As illustrated, the heat spreading material 250 may extend beyond the lateral dimensions of the chip 210 (shown in dotted lines) so that the connectors 252 may be provided laterally outside of the chip 210. It should be appreciated that the connectors 252 may represent a plurality of individual connector elements or a substantially continuous connector element may be provided, as is for instance shown in FIG. 2c. Furthermore, as illustrated, the openings or through holes 253 may be appropriately positioned within the base layer 251 so as to expose the corresponding contact structure 215, for instance in the form of the metal regions 215B or the bumps 215A (FIG. 2a).

It should be appreciated that the heat spreading material 250 may be formed on the basis of established manufacturing techniques, for instance by micro machining, laser treatment and the like, in which the base layer 251 may be appropriately dimensioned and the corresponding openings 253 may be formed to correspond to the structure 215.

Figure 2C:
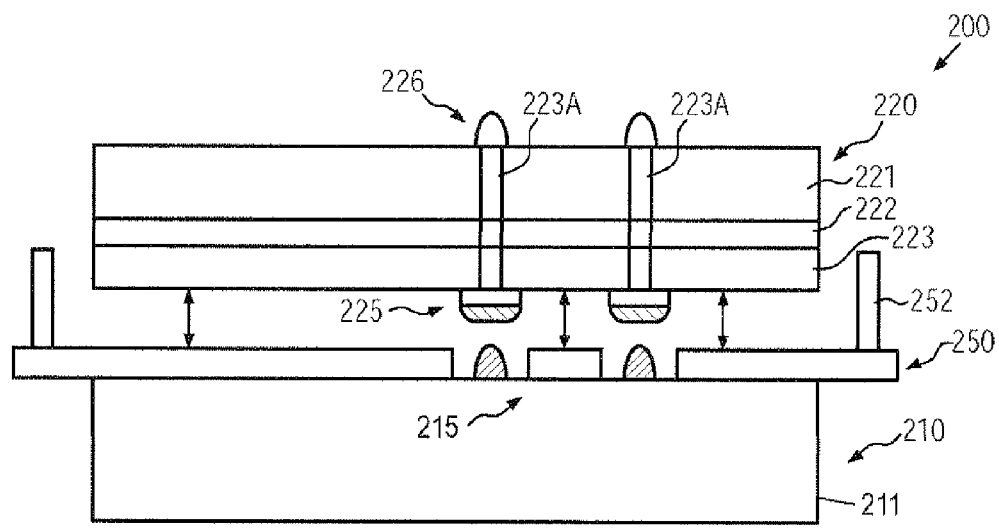

FIG. 2c schematically illustrates the device 200 in a further advanced manufacturing stage. As illustrated, a second chip 220 may be aligned to the first chip 210 and the heat spreading material 250. The second chip 220 may comprise a substrate 221, a device layer 222 and a metallization system 223. In the embodiment shown, the chip 220 may be attached to the chip 210 via the metallization system 223, which may thus comprise an appropriate contact structure 225 that corresponds to the contact structure 215. As previously indicated, the chips 210 and 220 may be attached to each other in a different manner, for instance by the substrate 221 and the metallization 213 (FIG. 2a), or via the substrates 221 and 211 (FIG. 2a), depending on the overall process and device requirements. In these cases, the contact structure 225 may be appropriately provided to enable a corresponding electrical connection. Furthermore, corresponding vias 223A may connect to the contact structure 225 and to the device level 222 and/or to the substrate 221 on which a carrier substrate may be attached in a later manufacturing phase.

With respect to forming the semiconductor chip 220, similar criteria may apply as previously explained with reference to the chip 210, wherein it should be appreciated that the chips may comprise different functional units, as previously explained.

Moreover, a further contact structure 226 may be provided, for instance in the form of solder bumps, metal pads of appropriate height and the like, in a similar manner as is described for the contact structures 215 and 225. The contact structure 226 may enable the connection of a further chip or a carrier substrate in a later manufacturing stage.

Figure 2D:
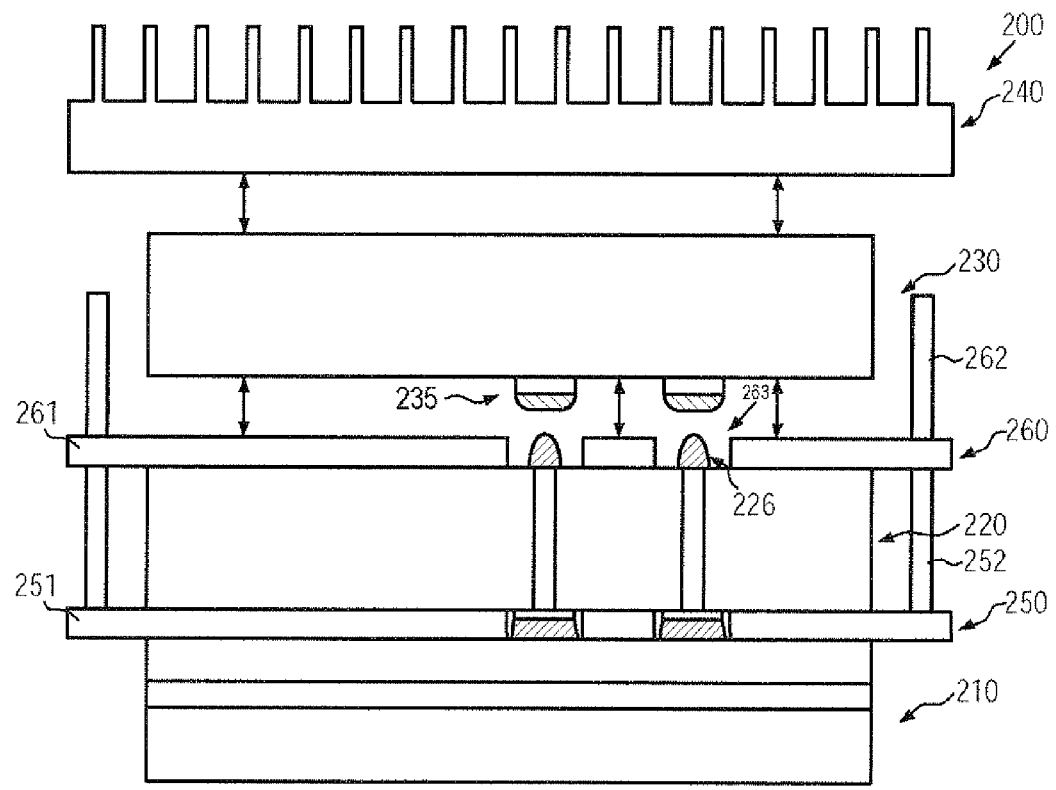

FIG. 2d schematically illustrates the device 200 in a further advanced manufacturing stage, in which the chips 210 and 220 are attached to each other with the heat spreading material 250 acting as an intermediate material layer. Furthermore, an electrical and mechanical connection may be obtained on the basis of the contact structures 215, 225, as previously explained. In addition, a further chip or a carrier substrate 230 may be aligned to the second chip 220, while additionally a further heat spreading material 260, which may include a base layer 261, corresponding openings 263 and thermal connectors 262 in a similar manner as is also described with reference to the heat spreading material 250. Furthermore, with respect to the selection of the corresponding materials for the base layer 261 and the connectors 262, the same criteria may apply as previously explained with reference to the material 250.

Furthermore, the carrier substrate 230 may comprise an appropriate bump structure 235 corresponding to the contact structure 226. Additionally, a heat sink 240 may be provided that may be attached to the carrier substrate 230. It should be appreciated that the carrier substrate 230 may comprise any wiring structure as is required for connecting the device 200 to the periphery, as is also explained when referring to the conventional device 100. Similarly, the heat sink 240 may have a similar configuration as a conventional heat sink wherein, however, the connectors 262 of the heat spreading material 260 may connect to the heat sink 240 after assembly of the device 200, thereby establishing a thermally highly conductive path from the heat sink 240 to the heat spreading material 260, i.e., the base layer 261, and to the material 250, i.e., the base layer 251. Assembly of the device 200 as shown in FIG. 2d may be accomplished by well-established techniques, for instance by reflowing the bumps of the corresponding bump structure, by providing an adhesive and the like, depending on peripheral device and process requirements.

Figure 2E:
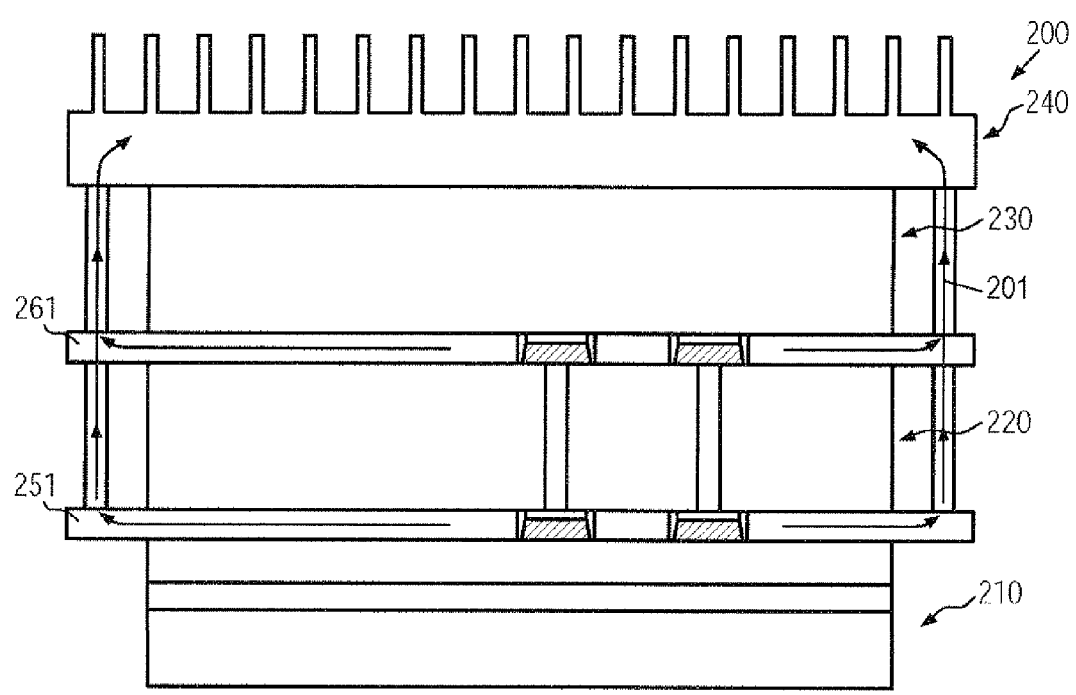
FIG. 2e schematically illustrates a cross-sectional view of a three-dimensional semi-conductor device in a finally assembled configuration, according to illustrative embodiments.

FIG. 2e schematically illustrates the semiconductor device 200 in a finally assembled state, in which the heat sink 240 and the carrier substrate 230 are tightly connected to the heat spreading material 261 and the second chip 220. As illustrated, during operation of the device 200, enhanced heat dissipation capabilities may be provided for the chips 210 and 220 via the thermally conductive paths 201. It should be appreciated that by thermally coupling the chips 210 and 220 via the heat sink 240 and the thermally conductive paths 201, an increased thermal balance between the chips 210 and 220 may be accomplished, since a lower temperature of, for instance, the chip 210 may result in a certain degree of redistribution of heat from the chip 220 to the chip 210, thereby "cooling" the chip 220 while also bringing the chip 210 closer to a temperature of the chip 220. In this manner, a reduced temperature gradient from one chip to the other may be accomplished. Thus, by positioning the chip producing the highest heat during operation closest to the heat sink 240, the heat transfer between the corresponding chip and the heat sink 240 may be most efficient, while at the same time the neighboring chip may also act as a heat sink of the chip of highest temperature, thereby providing an even further enhanced cooling effect. It should be appreciated that three or more chips may be stacked in the device 200, wherein, between at least some of the additional chips, corresponding heat spreading materials may be used. In other cases, less critical chips may be stacked without an intermediate heat spreading material. In this case, the corresponding thermally conductive connectors, such as the connectors 252 and 262 (FIG. 2d) may have an appropriate length so as to "bridge" the corresponding chips without intermediate heat spreading material.

As previously discussed, the heat spreading material 251 may also act as a base material for forming therein thermocouples, i.e., conductors of different material compositions, which may have a common interface on which a voltage drop may occur depending on a temperature gradient existing between the interface and a certain "reference" region, into which the conductors of different material may extend. Since a high degree of flexibility may be provided with respect to selecting appropriate materials for the base layers, such as the layers 251, 261, appropriate material combinations may be implemented therein, such as copper constantan, i.e., a copper nickel alloy, and the like, which may act as a thermocouple so as to obtain a desired voltage drop. Thus, in some illustrative embodiments, the corresponding thermocouples may be used for monitoring the temperature directly within the heat spreading materials by connecting the conductors to an evaluation circuitry, which may be provided in one of the adjacent chips. A corresponding electrical connection may be established by means of an appropriate contact structure formed on the respective base material 251, 261. Based on the temperature monitoring, the operation of the device 200 may be controlled, for instance, with respect to exceeding critical temperatures and the like. In still other illustrative embodiments, a plurality of corresponding thermocouples may be implemented to form a series of thermocouples which may be electrically connected in series, while thermally being connected in parallel. In this manner, the thermocouples may be used as active cooling elements by forcing a current through the thermocouples, which may result in a current-induced cooling effect. In other cases, the voltage drop created by the corresponding temperature gradient may be used as a voltage source that may be used as a part of a supply voltage of one or more of the chips contained in the device 200.

With reference to FIGS. 3a-3f, further illustrative embodiments will now be described, in which the heat spreading material may be provided as a chip internal material.

Figure 3A:
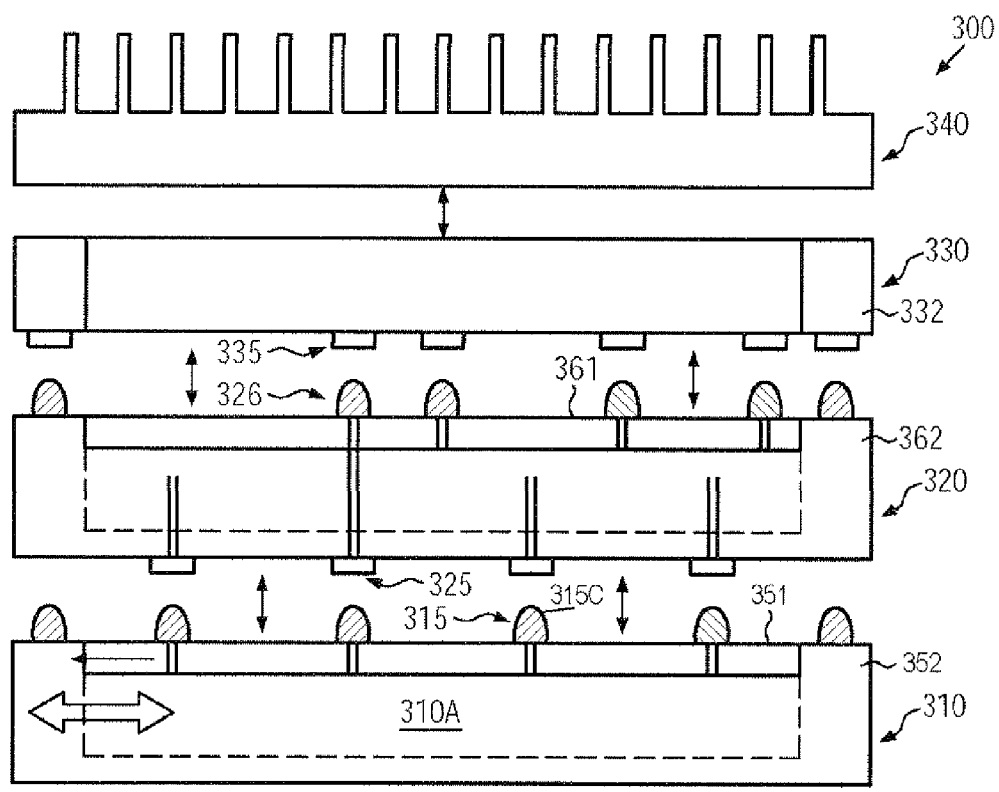
FIG. 3a schematically illustrates a cross-sectional view of individual components of a three-dimensional chip configuration according to further illustrative embodiments in which a chip internal heat spreading material may be provided in combination with a chip internal heat sink and/or heat conduction system.

FIG. 3a schematically illustrates a cross-sectional view of a semiconductor device 300 comprising a first chip 310, a second chip 320, a carrier substrate 330 and a heat sink 340, which are aligned to each other. The first chip 310 may comprise a chip area 310A in which corresponding circuitry may be provided, for instance, in the form of circuit elements, metallization structures and the like, as is required for the electrical performance of the corresponding functional unit under consideration. For instance, the chip area 310A may correspond to the chip 210 or 110, as previously described. That is, a lateral dimension of the chip area 310A may be selected so as to accommodate the corresponding components of an electronic circuit under consideration. Additionally, the chip 310 may comprise heat sink areas or thermal connectors 352, which may represent a peripheral region of the chip 310. Thus, compared to the chips 110 and 210, the peripheral region 352 may provide enhanced heat dissipation capabilities and heat conductivity, wherein a lateral dimension may be selected to be approximately 50 µm to several hundred µm and more, depending on the desired thermal performance. Thus, the chip 310 may have increased lateral dimensions compared to the chips 110, 210 depending on the lateral size of the region 352. Additionally, a heat spreading layer 351 may be provided, for instance as a part of a contact structure 315 that is adapted to connect to a contact structure 325 of a further chip 320. Furthermore, the contact structure 315 may comprise appropriate contact elements 315C, which may also allow an electric and thus thermal connection of the regions 352 to the chip 320.

Similarly, the chip 320 may have an increased lateral dimension corresponding to the dimensions of the chip 310 so as to accommodate a corresponding peripheral region or connector region 362. Furthermore, a heat spreading layer 361 may be provided, for instance, within a corresponding contact structure 326, which may allow an electrical and thermal connection to a corresponding structure 335 of the carrier substrate 330. Similarly, the carrier substrate 330 may have adapted lateral dimensions so as to provide a peripheral or connector region 332, which may connect to the region 362 via the contact structure 326.

The semiconductor device 300 as shown in FIG. 3a may be formed on the basis of process techniques which may also be described later on in more detail with reference to FIGS. 3b-3f. Thus, after providing the individual components having the appropriate lateral dimensions and the connector regions 352, 362 and 332, the components may be attached to each other on the basis of well-established techniques, such as reflowing of a solder material and/or applying an adhesive and the like. Thus, during operation, a highly efficient heat dissipation may be accomplished via the corresponding heat spreading layers 351, 361, which may be comprised of metal materials, such as aluminum, copper and the like, so that heat may efficiently be conducted to the peripheral regions 352, 362, which may act as efficient heat sinks due to the moderately large surface area provided at the periphery of the chips 310, 320. Additionally, the heat spreading layers 351, 361 may be connected to the heat sink 340 via the chip internal connector regions 352, 362 at the connector region 332. Hence, a similar heat distribution effect may be accomplished as previously described with reference to the device 200, wherein, however, the process of assembling the device 300 may be significantly enhanced due to the chip internal provision of the heat spreading components.

Figure 3B:
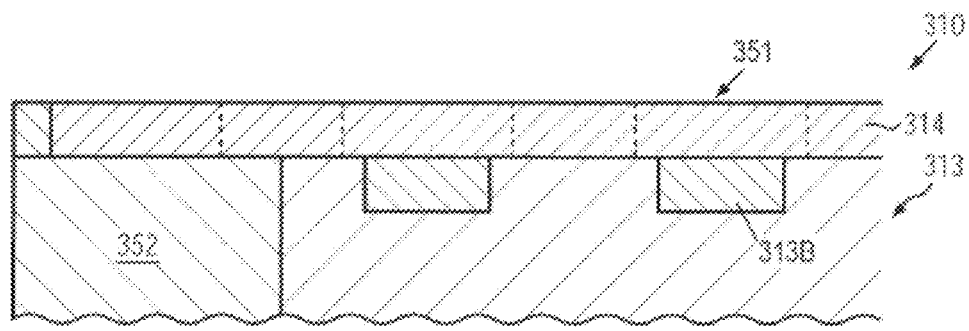
FIGS. 3b-3f schematically illustrate cross-sectional views of a metallization system of a chip during various manufacturing stages in which a chip internal heat spreading and distribution system may be provided within the metallization system, according to still further illustrative embodiments.

FIG. 3b schematically illustrates a cross-sectional view of a portion of the chip 310 in an initial manufacturing phase for forming the heat spreading layer 351. For this purpose, an appropriate dielectric material may be formed on a last metallization layer of the metallization system 313, which may subsequently be patterned to provide a mask for forming the heat spreading material, for instance in the form of a metal, while avoiding electrical contact to corresponding metal regions 313B of the metallization system 313, which may be used as metal pads for forming thereon contact elements of the contact structure 315 (FIG. 3a). Furthermore, as is illustrated, the peripheral region 352 may be provided in the form of any appropriate material, such as a metal and the like. It should be appreciated that the peripheral region 352 may be formed together with the metallization system 313 on the basis of well-established manufacturing techniques. Thus, after completion of the metallization system 313, the dielectric material 314 may be deposited, for instance, in the form of photosensitive polyimide material, silicon dioxide, silicon nitride and the like. Thereafter, the material 314 may be exposed, if a photosensitive material may be used, while in other cases a resist mask may be provided for patterning the layer 314.

Figure 3C:
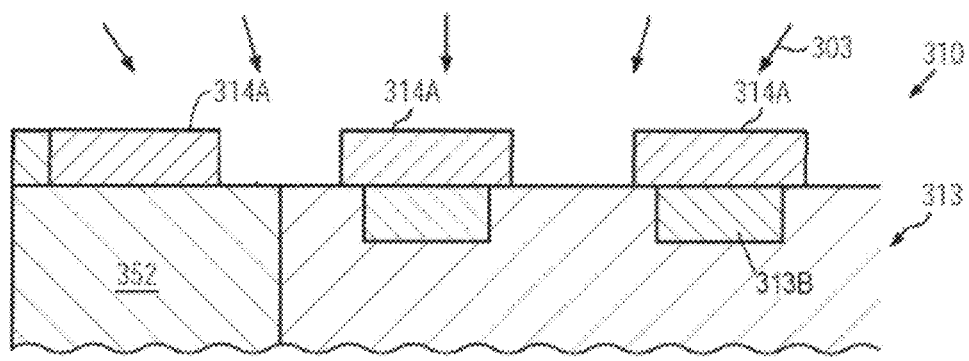

FIG. 3c schematically illustrates the chip 310 after patterning the dielectric material 314 to form respective islands 314A, which may cover regions in which a heat spreading material may not be deposited. Thus, the metal regions 313B may be covered by the islands 314A. Furthermore, the chip 310 may be exposed to a deposition ambient 303 for depositing a thermally highly conductive material, such as a metal, for instance in the form of copper, aluminum and the like, in device areas that are not covered by the islands 314A. This may be accomplished by, for instance, forming an appropriate conductive barrier material, if required, followed by the deposition of a seed material, if required, and subsequently depositing a desired metal, such as copper and the like. Thereafter, any excess material may be removed, for instance by CMP.

Figure 3D:
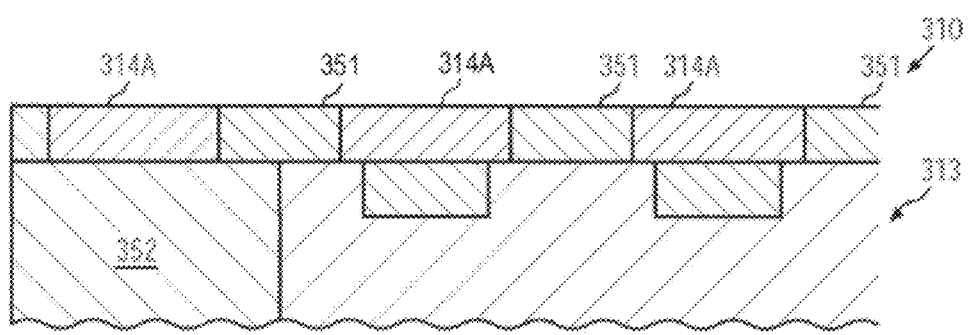

FIG. 3d schematically illustrates the chip 310 after the above-described process sequence. Hence, the layer 351 may be formed, for instance, as a copper layer and the like, except for islands covered by the dielectric material 314A.

Figure 3E:
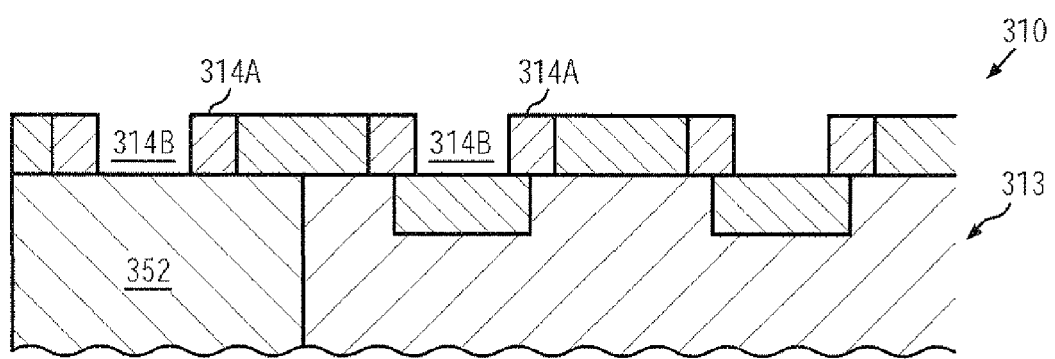

FIG. 3e schematically illustrates the chip 310 in a further advanced manufacturing stage, in which the islands 314A may be patterned to expose underlying metal regions in order to form a corresponding bump structure connecting to the exposed metal regions. For this purpose, an appropriate etch mask may be formed to define the position and the lateral size of corresponding openings 314B in the corresponding dielectric islands 314A. There-after, an appropriate "underbump" metallization may be deposited on the basis of well-established recipes and a bump material, such as a solder material, may be deposited on the basis of electrochemical deposition techniques, wherein a corresponding resist mask may define the lateral dimensions of the corresponding bumps. Thereafter, the "underbump" metallization material may be patterned in accordance with well-established process techniques.

Figure 3F:
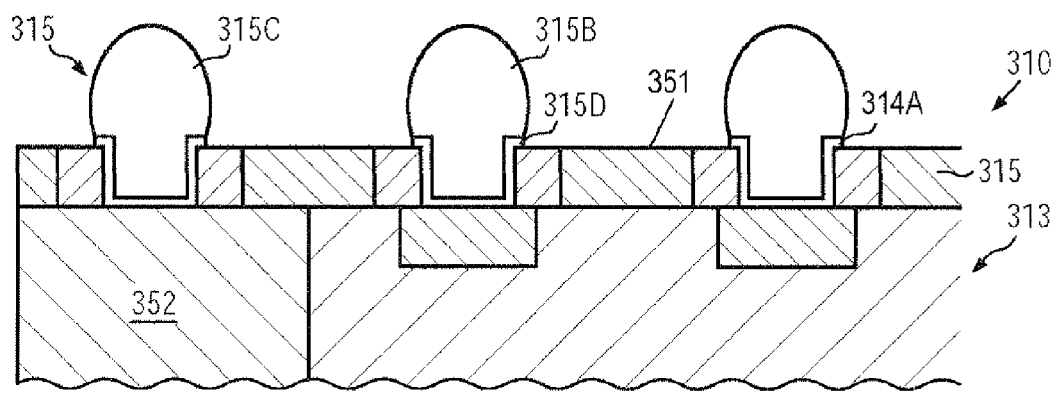

FIG. 3f schematically illustrates the resulting contact structure 315 comprising the bumps 315B and a respective under-bump metallization 315D. Thus, the dielectric islands 314A may provide a required electrical insulation of the various bumps 315D, while the remaining surface portions are covered by the heat spreading layer 351 having a high thermal conductivity, depending on the material composition and the thickness thereof. Furthermore, corresponding bumps 315C may connect to the peripheral region 352, thereby establishing a desired thermal contact to the corresponding peripheral region 362 (FIG. 3a) when attaching another chip to the chip 310.

Consequently, by providing the heat spreading material as a chip internal component, the respective manufacturing processes for forming the heat spreading layer and the corresponding connector structure may be performed on a wafer basis without significantly contributing to overall process complexity, while on the other hand significantly enhancing the overall assembly of a complex three-dimensional chip stack when superior heat dissipation capabilities are required.

As a result, the present disclosure provides semiconductor devices and techniques in which the heat dissipation within a stacked chip configuration may be significantly enhanced by providing an intermediate heat spreading material, which may be provided as a chip external material or a chip internal material. Furthermore, an appropriate patterning of the heat spreading material in the form of through holes or an appropriate patterning of a chip internal heat spreading layer may enable electrical contact to other chips with a high degree of compatibility with conventional three-dimensional concepts.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a first chip comprising a first substrate, a first device layer positioned directly on and covering said first substrate and comprising a plurality of first transistor elements, a first metallization system positioned directly on and covering said first device layer, and a first heat spreading layer positioned directly on and covering said first metallization system; and
a second chip attached to said first chip, said second chip comprising a second substrate, a second device layer positioned directly on and covering said second substrate comprising a plurality of second circuit elements, and a second metallization system positioned directly on and covering said second device layer, one of said second substrate and said second metallization system being attached to said first heat spreading layer.

2. The semiconductor device of claim 1, wherein said second chip further comprises a second heat spreading layer positioned directly on and covering said second metallization system.

3. The semiconductor device of claim 2, further comprising a carrier substrate attached to said second heat spreading layer.

4. The semiconductor device of claim 3, further comprising a heat sink attached to said carrier substrate.

5. The semiconductor device of claim 2, further comprising a first peripheral heat sink region that laterally encloses at least said first device layer and said first metallization system, wherein said first heat spreading layer is in direct contact with said first peripheral heat sink region.

6. The semiconductor device of claim 5, wherein said peripheral chip region has a lateral extension of approximately 100 µm or more.

7. A semiconductor device, comprising:
a first chip comprising a first chip area, a first heat spreading layer positioned directly on and covering said first chip area, and a first peripheral heat sink region laterally enclosing said first chip area and directly contacting said first heat spreading layer, wherein said first chip area comprises a first substrate, a first device layer positioned directly on and covering said first substrate and comprising a plurality of first transistor elements positioned proximate an active surface of said first chip area, and a first metallization system positioned directly on and covering said first device layer, said first peripheral heat sink region comprising a plurality of first thermal contact elements; and
a second chip attached to said first chip, said second chip comprising a second chip area and a second peripheral heat sink region laterally enclosing said second chip area, wherein said second chip area comprises a second substrate, a second device layer positioned directly on and covering said second substrate and comprising a plurality of second transistor elements positioned proximate an active surface of said second chip area, and a second metallization system positioned directly on and covering said second device layer, and wherein said plurality of first thermal contact elements attach said first peripheral heat sink region of said first chip to said second peripheral heat sink region of said second chip and are adapted to conduct heat from said first peripheral heat sink region to said second peripheral heat sink region.

8. The semiconductor device of claim 7, further comprising a carrier substrate attached to said second chip on an opposite side of said second chip from said first chip, said carrier substrate comprising a third peripheral heat sink region.

9. The semiconductor device of claim 8, wherein said second peripheral heat sink region comprises a plurality of second thermal contact elements, said second thermal contact elements attaching said second peripheral heat sink region of said second chip to said third peripheral heat sink region of said carrier substrate, said plurality of second thermal contact elements being adapted to conduct heat from said second peripheral heat sink region to said third peripheral heat sink region.

10. The semiconductor device of claim 8, further comprising a heat sink attached to said carrier substrate on an opposite side of said carrier substrate from said second chip, said third peripheral heat sink region being adapted to conduct heat from said second peripheral heat sink region to said heat sink.

11. The semiconductor device of claim 7, wherein said first peripheral heat sink region laterally surrounds said first heat spreading layer and wherein said first heat spreading layer laterally contacts said first peripheral heat sink region and is adapted to dissipate heat from said first chip area to said first peripheral heat sink region.

12. The semiconductor device of claim 8, wherein said second chip further comprises a second heat spreading layer positioned directly on and covering said second metallization system of said second chip area, said second heat spreading layer directly contacting said second peripheral heat sink region and being adapted to dissipate heat from said second chip area to said second peripheral heat sink region.

13. The semiconductor device of claim 7, wherein said first chip further comprises a plurality of third thermal contact elements positioned above said first heat spreading layer and said second chip further comprises a plurality of fourth thermal contact elements positioned below said second substrate, each of said plurality of third thermal contact elements being attached to a corresponding one of said plurality of fourth thermal contact elements and being adapted to conduct heat from said first chip to said second chip.

14. The semiconductor device of claim 12, wherein said second chip further comprises a plurality of fifth thermal contact elements positioned above said second heat spreading layer and said carrier substrate further comprises a plurality of sixth thermal contact elements, each of said plurality of fifth thermal contact elements being attached to a corresponding one of said plurality of sixth thermal contact elements and being adapted to conduct heat from said second chip to said carrier substrate.

15. The semiconductor device of claim 14, wherein said second chip further comprises a plurality through-chip vias, each respective one of said plurality of through-chip vias connecting a respective one of said plurality of fourth thermal contact elements positioned below said second substrate to a respective one of said plurality of fifth thermal contact elements positioned above said second heat spreading layer being adapted to conduct heat from at least said first heat spreading layer to said second heat spreading layer.

16. The semiconductor device of claim 7, wherein said first and second peripheral heat sink regions have a lateral extension outside of said respective first and second chip areas of at least approximately 50 µm.

17. A semiconductor device, comprising:
a first chip, comprising:
a first chip area comprising a first substrate, a first device layer positioned above said first substrate, a first metallization system positioned above said first device layer, and a first heat spreading layer positioned above said first metallization system, said first device layer comprising a plurality of first circuit elements positioned proximate an active surface of said first chip area;
a first peripheral heat sink region laterally enclosing said first chip area, wherein said first heat spreading layer laterally contacts said first peripheral heat sink region and is adapted to dissipate heat from said first chip area to said first peripheral heat sink region, said first peripheral heat sink region comprising a plurality of first thermal contact elements; and
a plurality of second thermal contact elements positioned above said first heat spreading layer; and
a second chip attached to said first chip, said second chip comprising:
a second chip area comprising a second substrate, a second device layer positioned above said second substrate, a second metallization system positioned above said second device layer, and a first heat spreading layer positioned above said first metallization system, said second device layer comprising a plurality of second circuit elements positioned proximate an active surface of said second chip area;
a plurality of third thermal contact elements positioned below said second substrate; and a second peripheral heat sink region laterally enclosing said second chip area, wherein said second heat spreading layer laterally contacts said second peripheral heat sink region and is adapted to dissipate heat from said second chip area to said second peripheral heat sink region, wherein said plurality of first thermal contact elements attach said first peripheral heat sink region of said first chip to said second peripheral heat sink region of said second chip and are adapted to conduct heat from said first peripheral heat sink region to said second peripheral heat sink region, and wherein each of said plurality of second thermal contact elements is attached to a corresponding one of said plurality of third thermal contact elements and is adapted to conduct heat from said first chip to said second chip.

18. The semiconductor device of claim 5, wherein said second chip further comprises a second peripheral heat sink region laterally enclosing at least said second device layer and said second metallization system, said second heat spreading layer directly contacting said second peripheral heat sink region.

19. The semiconductor device of claim 18, wherein at least one of said first and second heat spreading layers extends over and covers a respective one of said first and second peripheral heat sink regions.

20. The semiconductor device of claim 1, wherein each of said first and second metallization systems comprises a plurality of stacked metallization layers that are adapted to establish electrical connections between said corresponding pluralities of first and second transistor elements, respectively, each of said plurality of stacked metallization layers comprising a dielectric material layer and at least one of a via and a metal line embedded in said layer of dielectric material, wherein said at least one of said via and said metal line is electrically connected to at least one transistor element of said respective pluralities of first and second transistor elements.

21. The semiconductor device of claim 1, wherein said first metallization layer covers an entirety of said first device layer and said first heat spreading layer covers an entirety of said first metallization system.

22. The semiconductor device of claim 2, wherein said second heat spreading layer covers an entirety of said second metallization system.

23. The semiconductor device of claim 7, wherein each of said first and second metallization systems comprises a plurality of stacked metallization layers that are adapted to establish electrical connections between said corresponding pluralities of first and second transistor elements, respectively, each of said plurality of stacked metallization layers comprising a dielectric material layer and at least one of a via and a metal line embedded in said layer of dielectric material, wherein said at least one of said via and said metal line is electrically connected to at least one transistor element of said respective pluralities of first and second transistor elements.

24. The semiconductor device of claim 7, wherein said first metallization layer covers an entirety of said first device layer and said first heat spreading layer covers an entirety of said first metallization system.

25. The semiconductor device of claim 7, wherein said first heat spreading layer is laterally enclosed by and laterally contacts said first peripheral heat sink region.

26. The semiconductor device of claim 12, wherein said second heat spreading layer covers an entirety of said second metallization system.

27. The semiconductor device of claim 12, wherein said second heat spreading layer is laterally enclosed by and laterally contacts said second peripheral heat sink region.

* * * * *